United States Patent [19]
Jensen

[11] 4,329,679
[45] May 11, 1982

[54] CHARGE COUPLED DEVICE FEEDBACK ANALOG-TO-DIGITAL CONVERTER USING SUCCESSIVE APPROXIMATIONS

[75] Inventor: William E. Jensen, San Pedro, Calif.
[73] Assignee: Hughes Aircraft Company, Culver City, Calif.
[21] Appl. No.: 83,421
[22] Filed: Oct. 10, 1979
[51] Int. Cl.³ ............................................. H03K 13/02
[52] U.S. Cl. .................... 340/347 AD; 307/221 D; 340/347 M; 357/24
[58] Field of Search .................. 340/347 M, 347 AD; 307/221 R, 221 C, 221 D; 357/24

[56] References Cited
U.S. PATENT DOCUMENTS

| | | | |
|---|---|---|---|
| 3,930,255 | 12/1975 | Means | 340/347 AD |
| 4,058,717 | 11/1977 | Engeler | 364/824 |
| 4,072,938 | 2/1978 | Buchanan | 340/347 AD |
| 4,092,549 | 5/1978 | Prince | 307/221 D |
| 4,107,670 | 8/1978 | Hornak | 340/347 DA |
| 4,126,852 | 11/1978 | Baertsch | 340/347 DA |
| 4,171,521 | 10/1979 | Wang et al. | 340/347 AD |

OTHER PUBLICATIONS

The Engineering Staff of Analog Devices, Inc., Analog-Digital Conversion Handbook, 6/1972, pp. II-80 & 81.

Primary Examiner—Thomas J. Sloyan
Attorney, Agent, or Firm—Robert M. Wallace; William H. MacAllister

[57] ABSTRACT

An analog-to-digital converter includes a charge coupled device comparator receiving an analog signal which is to be converted to an eight bit binary word. An eight bit charge coupled device shift register addresses an eight bit digital-to-analog converter through eight separate resettable latches to generate a reference signal which is compared in successive approximations to the analog signal by the charge coupled device comparator to generate each binary bit of the eight bit word. Sensitivity of the charge coupled device comparator is enhanced by the use of charge coupled regenerative feedback to generate each binary bit of the eight bit binary word, which is read serially into an output register. The charge coupled device comparator decides whether each bit of the eight bit binary word is to be a logic one or a logic zero by comparing the analog input signal with reference signals selected in successive approximations by a shift register addressing the digital-to-analog converter. The analog signal is compared with a progressively increasing reference signal whose magnitude is increased by successively smaller increments. Eight such successive approximations and comparisons are made in order to generate the eight bit binary word.

8 Claims, 5 Drawing Figures

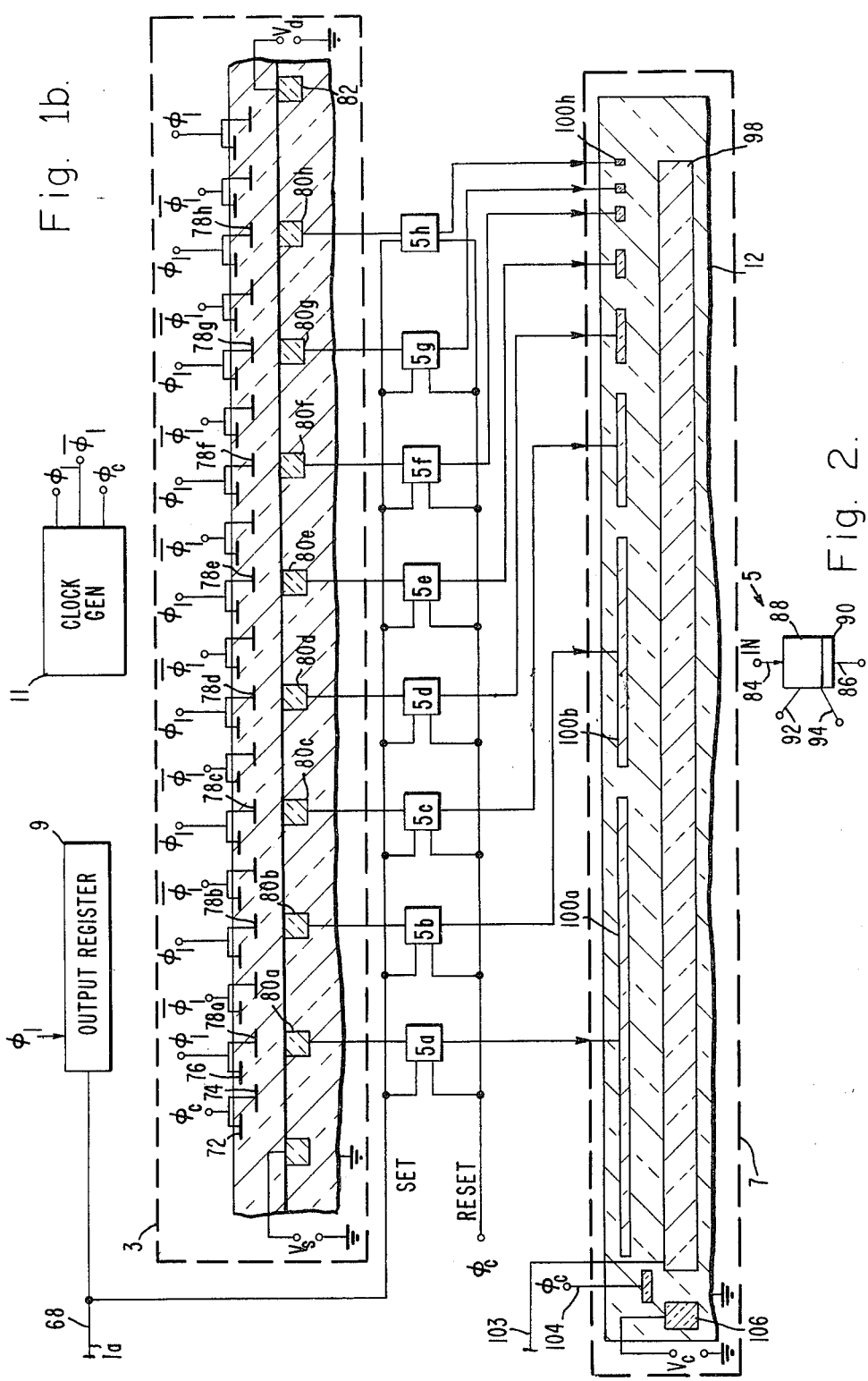

//4,329,679

CHARGE COUPLED DEVICE FEEDBACK ANALOG-TO-DIGITAL CONVERTER USING SUCCESSIVE APPROXIMATIONS

TECHNICAL FIELD

This invention relates to charge coupled devices and to charge coupled device analog-to-digital converters formed on a single monolithic semicoductive substrate.

BACKGROUND ART

Analog-to-digital converters are well known in the art, having relatively large size and high power consumption. An analog-to-digital converter encodes an analog signal, S, as a sum of powers of $\frac{1}{2}$:

$$S \cong \sum_{n=1}^{M} b_n (\tfrac{1}{2})^{-n} \text{ (for an M-bit machine)}$$

where $b_n$'s are 1 or 0, and the full scale reference is taken to be 1.0. The conventional successive approximation algorithm for determining the $b_n$'s is to compare S with $$R_k = \sum_{n=1}^{k-1} b_n \frac{1}{2^n} + \frac{1}{2^k}$$

for the kth bit conversion. If S exceeds $R_k$, $b_k=1$ and if S is less than $R_k$, $b_k=0$. The k+1 reference then becomes:

$$R_{k+1} = R_k - \frac{\bar{b}_k}{2^k} + \frac{1}{2^{k+1}}$$

where a subtraction is involved. ($\bar{b}_k$, 0, 1 for $b_k=1$, 0 respectively).

Stating the above nonmathematically, the signal S is progressively compared with $$R = \tfrac{1}{2}, \tfrac{1}{2}+\tfrac{1}{4}, \tfrac{1}{2}+\tfrac{1}{4}+\tfrac{1}{8}, \text{ etc.}$$

As soon as R exceeds S, the last added fraction ($\frac{1}{8}$) must be subtracted and the next in the series of ($1/2^n$) (e.g. (1/16) added. The approximations then continue by successively adding progressively smaller members of the series ($1/2^n$) to R until it again exceeds S, at which time the member of the series (say (1/32) which caused R to exceed S is subtracted from R and, prior to the next comparison, the next member in the series (1/64) is added to R. The process continues through a series of approximations depending in number on the desired precision of the system. Typical analog-to-digital converters, such as those formed as bipolar devices, are not easily integrated with charge coupled device hardware. Such integration may require additional hardware to act as a buffer between the charge coupled device hardware and the analog-to-digital converter. Therefore, a significant problem in the art is that integration of charge coupled devices with currently available analog-to-digital converters may require additional hardware to provide compatibility between charge coupled devices and the analog-to-digital converter.

SUMMARY OF THE INVENTION

The size and power consumption of the analog-to-digital converter of the present invention is greatly reduced without sacrificing speed and while realizing the advantages of devices formed on a single monolithic substrate, by forming the analog-to-digital converter as a charge coupled device. The analog-to-digital converter of the present invention utilizes regenerative feedback to provide increased sensitivity. Because the analog-to-digital converter is a charge coupled device, it is inherently compatible with other charge coupled device hardware and is therefore easily integrated on the same monolithic substrate with other charge coupled device hardware without requiring additional buffering hardware.

In the preferred embodiment, the analog-to-digital converter of this invention includes a charge coupled device comparator receiving an analog signal which is to be converted to an eight bit binary word. An eight bit charge coupled device shift register addresses an eight bit digital-to-analog converter through eight separate resettable latches to generate a reference signal which is compared in successive approximations to the analog signal by the charge coupled device comparator to generate each binary bit of the eight bit word. Sensitivity of the charge coupled device comparator is enhanced by the use of charge coupled regenerative feedback to generate each binary bit of the eight bit binary word, which is read serially into an output register. The charge coupled device compartor decides whether each bit of the eight bit binary word is to be a logic one or a logic zero by comparing the analog input signal with an initial reference signal incremented by successively smaller reference signals selected in successive approximations by a shift register addressing the digital-to-analog converter. Eight such successive approximations and comparisons are made in order to generate the eight bit binary word.

The entire charge coupled device analog-to-digital converter is formed on a single monolithic semiconductive substrate which, in the preferred embodiment, is of p-type conductivity to provide an n-channel charge coupled device. The eight resettable latches through which the shift register addresses the digital-to-analog converter are formed as n-channel metal oxide semoconductor field effect transistor (MOSFET) devices. Advantageously, all the elements of the analog-to-digital converter of this invention, including the comparator shift register, the digital-to-analog converter, the resettable latches and the output register, are formed on the same monolithic substrate and are fabricated simultaneously, significantly reducing cost and power consumption and permitting a miniaturization of geometry. As a result, the analog-to-digital converter of this invention may be integrated on a monolithic substrate with other charge coupled devices without requiring additional hardware to provide compatability.

BRIEF DESCRIPTION OF THE DRAWINGS

The invention is best understood by reference to the accompanying drawings, of which:

FIG. 1a and 1b taken together comprise a schematic diagram of the preferred embodiment of the charge coupled device analog-to-digital converter of this invention;

FIG. 2 is a simplified block diagram of the resettable latch and inverter utilized in the device of FIG. 1;

DETAILED DESCRIPTION OF THE INVENTION

Figure 1A:
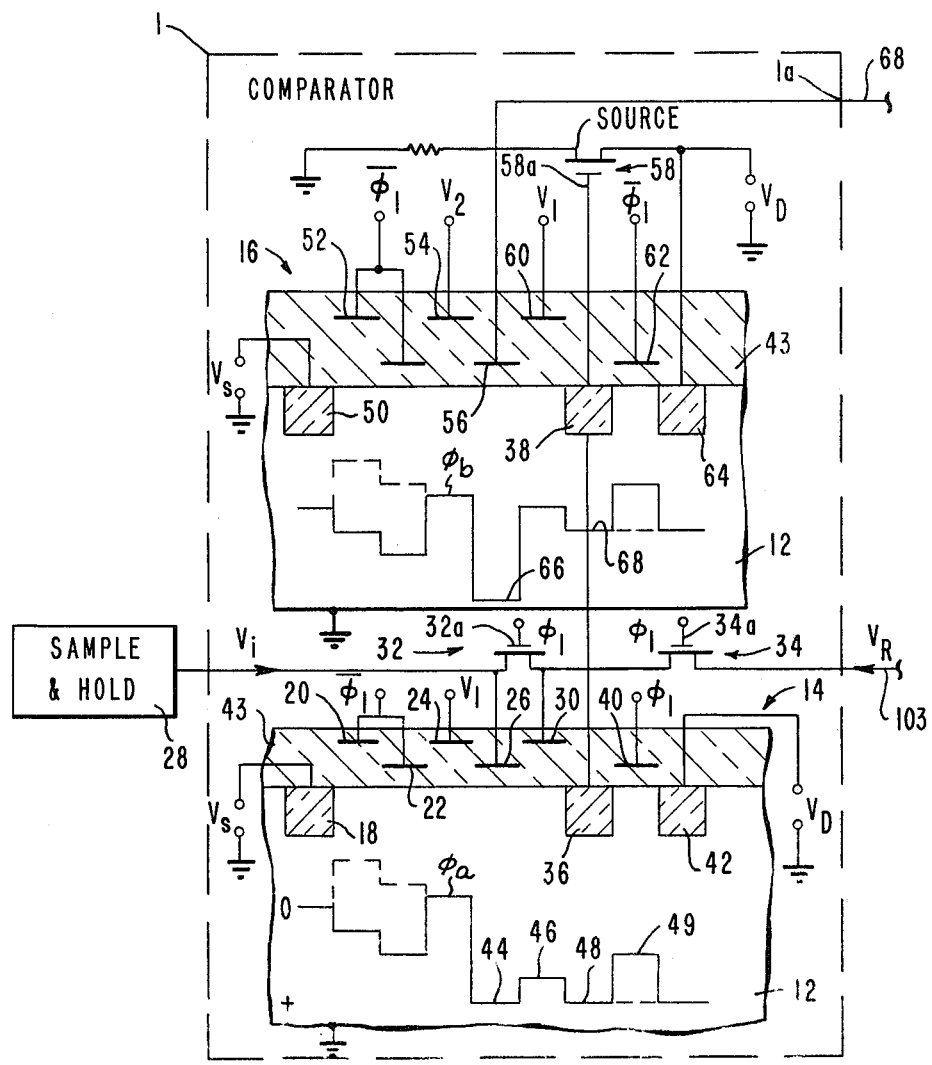

Referring to the schematic diagram of FIG. 1, the charge coupled device analog-to-digital converter of the present invention includes a charge coupled device comparator 1, an eight bit charge coupled device shift register 3, eight resettable inverting latches 5, and a charge coupled digital-to-analog converter 7 which is addressed by the shift register 3 through the plurality of resettable latches 5 to supply a reference signal $V_r$ to the charge coupled device comparator 1. The comparator 1 compares the reference signal $V_r$ with an input signal $V_i$ which is to be converted to an eight bit binary word and stored in a register 9. In the preferred embodiment, each of the devices 1, 3, 5, 7 and 9 is an n-channel device formed on the same p-type monolithic substrate. Charge transfer in each of the charge coupled devices of FIG. 1 is under the control of a clock generator 11 which generates clock signals $\phi_I$, $\overline{\phi_I}$ $\phi_c$, of positive voltage to be applied at various points in each of the n-channel charge coupled devices 1, 3 and 7 of FIG. 1. The time domain waveforms of the clock signals $\phi_I$, $\overline{\phi_I}$ and $\phi_c$ are illustrated respectively in FIGS. 3a, b and c, showing that $\phi_I$ and $\overline{\phi_I}$ are complementary pulse signals having a frequency eight times the frequency of the clock signal $\phi_c$. Charge transfer devices and charge coupled devices are well known in the art and are discussed, for example, in Sequin et al., *Charge Transfer Devices,* Academic Press, 1975.

The charge coupled device comparator 1 is formed over a p-type semiconductive substrate 12 and includes first and second charge flow channels 14 and 16 respectively. In the first charge flow channel, negative charge is injected from an input diode diffusion 18 of n-type conductivity which is forward biased by a source voltage supply $V_s$. An upper electrode 20 and a lower electrode 22 are connected to receive the clock signal $\overline{\phi_I}$ from the clock generator 11. An upper level electrode 24 is connected to a constant voltage source $V_I$. A charge storing electrode 26 is connected to receive the analog signal $V_i$ from a sample and hold means 28, which may be of the type discussed in Penney et al., *MOS Integrated Circuits,* Van Nostrand, Reinhold, N.Y., 1972, pp. 264-312 and 256-260. A comparison electrode 30 is connected through an input transistor 32 to receive the input signal $V_i$ from the sample and hold means 28. The transistor 32 is an n-channel metal oxide semiconductor field effect transistor (MOSFET) of the type disclosed in the Penney publication referenced above, having a gate 32a connected to receive the clock signal $\overline{\phi_I}$. The comparison electrode 30 is also connected to receive the reference signal $V_r$ from the digital-to-analog converter 7 through an n-channel MOSFET reference transistor 34 of the same type as the MOSFET transistor 32, having its gate 34a connected to receive the clock signal $\overline{\phi_I}$. An n-type charge sensing diode diffusion 36 is disposed in the charge flow channel 14 immediately adjacent the comparison electrode 30 and is electrically connected to another n-type charge sensing diode diffusion 38 in the second charge flow channel 16. A reset electrode 40 is disposed in the first channel 14 between the charge sensing diffusion 36 and an output diode diffusion 42 which is reverse biased by a drain voltage supply $V_d$. The electrodes 20, 22, 24, 26, 30 and 40 are formed in an insulated conductive film 43 overlying the substrate 12 and create an electrical surface potential $\phi_a$ in the top surface of the substrate 12 under control of clock generator 11. The relative magnitude of the surface potential $\phi_a$ beneath each of the electrodes 20, 22, 24, 26, 30 and 40 is indicated in FIG 1a. Briefly, charge flow in the channel 14 occurs as follows: Each time the clock signal $\overline{\phi_I}$ is negative ("off"), the surface potential $\phi_a$ assumes the dashed line configuration indicated in FIG. 1a, causing a charge packet from the diode diffusion 18 previously stored beneath the electrodes 20 and 22 to spill over the potential barrier beneath the electrode 24 and be stored in a potential well 44 in the surface potential beneath the storage electrode 26 in the manner of CCD fill and spill charge injection well known in the art. When the clock signal $\overline{\phi_I}$ is "on", the input transistor 32 is "on" so that the height of potential barrier 46 is controlled by the magnitude of the input signal $V_i$ applied to the comparison electrode 30 through input transistor 32. When $\phi_I$ is "on," and $\overline{\phi_I}$ is off, only the reference transistor 34 is "on" so that the height of the barrier 46 beneath the comparison electrode 30 is controlled by the reference signal $V_r$ applied through the reference transistor 34 to the comparison electrode 30. If $V_r$ and $V_i$ are of the same magnitude, the height of the potential barrier 46 does not change, so that none of the charge stored in the potential well 44 can flow over the barrier 46 into adjacent potential well 48 beneath the charge sensing diffusion 36c. However, if the reference signal $V_r$ is less positive than the input signal $V_i$, the height of the barrier 46 will decrease when $\overline{\phi_I}$ is turned "on", allowing charge stored in the potential well 44 to spill over the potential barrier 46 into the adjacent potential well 48, and to be sensed by the charge sensing diffusion 36, and by the sensing diffusion 38 in the second charge flow channel 16.

The second charge flow channel 16 includes an input diode diffusion 50 which is forward biased by the source voltage supply $V_s$. Adjacent the input diffusion 50 is an upper electrode 52 and an adjacent lower electrode 53, both connected to receive the clock signal $\overline{\phi_I}$ from the clock generator 11. An upper level electrode 54 is connected to a constant voltage supply $V_2$. Adjacent the electrode 54 is a charge-storing electrode 56 which is connected to the source of a MOSFET transistor 58 having its drain connected to a voltage supply $V_d$. A barrier electrode 60 is disposed between the charge storing electrode 56 and the sensing diffusion 38. A reset electrode 62 is disposed between the sensing diffusion 38 and a drain diode diffusion 64 which is biased by the drain voltage supply $V_d$. The sensing diffusion 38 is connected to gate 58a of the transistor 58. Each of the electrodes 52, 53, 54, 56, 60 and 62 are formed in an insulated conductive film 43 disposed over the semiconductive substrate 12 to create an electrical surface potential $\phi_b$ beneath the electrodes 52, 53, 54, 56, 60 and 62 as indicated in dashed line in FIG 1a. Briefly, charge flow in the second charge flow channel 16 occurs as follows: Each time the clock signal $\overline{\phi_I}$ is "off," the surface potential $\phi_b$ assumes the dashed line configuration indicated in FIG. 16, so that charge from the input diffusion 50 previously stored beneath the electrodes 52, 53 spills over the potential barrier beneath electrode 54 and fills a potential well 66 in the surface potential $\phi_b$.

The depth of the potential well 66 is determined by the voltage applied from the source of the transistor 58 to the charge storing electrode 56. When a less positive voltage is applied to the sensing diffusion 38 in the second charge flow channel 16 from the sensing diffusion 36 in response to negative charge in the first charge flow channel 14, the source-to-drain conductance of the transistor 58 is decreased, decreasing the amount of positive voltage applied to the charge storing electrode 56, thereby decreasing the depth of the potential well 66 beneath the charge storing electrode 56. As a result, some of the charge stored in the potential well 66 spills into an adjacent potential well 68 beneath the sensing diffusion 38. The spilled charge is sensed by the sensing diffusion 38, increasing the amount of negative voltage applied to the gate of the transistor 58 which further decreases the amount of positive voltage applied to the charge storing electrode 56. This creates a regenerative feedback loop, causing more charge to be spilled from the potential well 66 into the adjacent potential well 68 underlying the sensing diffusion 38 at a rapidly increasing rate, raising the source-to-drain resistance of the transistor 58 until all of the charge previously stored at the potential well 66 is stored in the potential well 68. As a result, the potential of the charge storing electrode 56 becomes less positive, causing a negative-going pulse to appear at the output 68 of the charge coupled device comparator 1. Thus, as long as the analog input signal $V_i$ is slightly more positive than the reference signal $V_r$, a negative going pulse is generated at the output 68, so that the comparator 1 is extremely sensitive to negative differences between the signals $V_i$ and $V_r$.

The charge coupled device addressing shift register 3 is formed on the semiconductive substrate 12, and includes an input diode diffusion 70 of n-type conductivity which is biased by the source voltage supply $V_s$. Adjacent the input diffusion 70 are upper and lower level charge input electrodes 72, 74 formed in upper and lower insulated conductive layers over the substrate 12. The shift register 3 is an n-channel two-phase, 4 electrode-per-bit charge coupled device of the type well known in the art and includes 16 electrode pairs of upper and lower level electrodes 76, 78 respectively. Alternate pairs of adjacent ones of the upper and lower level electrodes 76, 78 are connected to receive the clock signal $\phi_l$, while the remaining pairs are connected to receive the clock signal $\overline{\phi_l}$. Alternate ones of the lower level electrodes 78 are adjacent ones of eight floating charge sensing n-type conductivity diffusions 80 formed in the substrate 12. Each of the floating diffusions 80 is of the type discussed in Sequin et al., *Charge Transfer Devices*, Academic Press (1975), pp. 52–55, and is connected to one of eight resettable inverting latches 5. The charge input electrodes 72, 74 are connected to receive the clock signal $\phi_c$. When the clock signal $\phi_c$ is "on," a charge packet flows from the input diffusion 70 under the electrode pair 72, 74, to be subsequently transferred under the electrode pairs 76, 78 to be sensed successively by each one of the eight floating diffusions 80 each time the clock signal $\phi_l$ is on, after which the charge packet is finally clocked into a drain diffusion 82 which is biased by the drain voltage supply $V_d$. As the charge packet is clocked along the length of the shift register 3, a less positive voltage is created successively in each of the sensing diffusions 80 and is applied to successive ones of the inverting resettable latches 5.

Each of the inverting resettable latches 5 corresponds to the simplified diagram of FIG. 2, showing a latch 5 having an input 84 and an output 86. The latch 5 is an inverting resettable latch formed as a metal oxide semiconductor field effect transistor device using logic design considerations discussed in Penney et al., *MOS Integrated Circuits*, Van Nostrand, Reinhold Inc., N.Y., 1972, pp. 252–260. The latch 5 includes and an inverter 90. The latch 88 includes a data input 84, a set control 92 and a reset control 94. Output data from the latch 88 enters the inverter 90 and an inverted output signal appears at the output 86. If no voltage is applied to the set control 92, the signal at the output 86 is the logical inverse of the signal at the input 84. Application of a logic one to the set control 92 causes the voltage at the output 86 to be permanently set to its current state. Application of a positive voltage to the reset control 94 causes the latch 88 to return to its original state. FIG. 1 shows that respective ones of the latches 80 are connected to successive ones of the sensing diffusions 80 in the shift register 3. Each of the set controls 92 is connected to the output 68 of the comparator 1, while each of the reset controls 94 is connected to receive the clock signal $\phi_c$ from the clock generator 11.

The reference voltage $V_r$ is derived from any suitable digital-to-analog converter means which is currently available. However, in the preferred embodiment, a digital-to-analog converter 7 of the type disclosed in U.S. patent application Ser. No. 917,715 filed on June 21, 1978 by the present inventor and assigned to the present assignee, is utilized, and includes eight electrodes 100 of successively smaller areas overlying a common electrode 98. The common electrode 98 is a diffused region of n-type conductivity formed in the p-type substrate 12. The eight electrodes 100 are formed in an insulated conductive film 43 overlying the substrate 12, and each one is connected to the output 86 of one of the eight resettable latches 5. The successively smaller areas of the electrodes 100 are selected so that a voltage applied successively to successive ones of the electrodes 100 induces voltages in the common electrode 98 of successively smaller magnitudes proportional to decreasing negative powers of two. Thus, for example, a particular voltage $V_p$ applied to the electrode 100a will induce $2^{-1}$ volt in the common electrode 98. If the voltage $V_p$ is applied instead to the electrode 100b, $2^{-2}$ volt will be induced in the common electrode 98. Similarly, if the voltage $V_p$ is applied to the last electrode 100h, a potential of $2^{-8}$ volt will be induced in the common electrode 98. In this way the digital-to-analog converter 7 generates analog signals representative of fractional eight-bit binary numbers which may be selectively addressed through the eight resettable latches 5 by the shift register 3. Thus, as a charge packet is shifted from left to right in the shift register 3, a voltage is successively induced in each of the floating diffusions 80, which is applied sequentially through the various latches 5 to each of the capacitive electrodes 100 to serially address analog signals representative of the binary numerical progression $2^{-1}, 2^{-2}, 2^{-3}, \ldots 2^{-8}$. These analog signals are applied to the comparator 1 through output conductor 103 as the reference voltage $V_r$. The induced voltage $V_r$ in the common electrode 98 may be periodically reset to zero by a reset electrode 104 connected to receive the clock signal $\phi_c$ and disposed between the common electrode 98 and a drain diffusion 106 which is connected to ground. The reset electrode 104 inverts the surface of the substrate 12 between the common electrode diffusion 98 and the drain diffusion 106 so that the surface potential in the common electrode 98 is reset to a selected potential $V_c$ whenever the clock signal $\phi_c$ is on. It should be apparent to those skilled in the art that the voltage $V_c$ must be selected to provide an output voltage range applied to the electrode 30 to create a surface potential 46 consistent with the surface potential diagram of FIG. 6.

Figure 4:
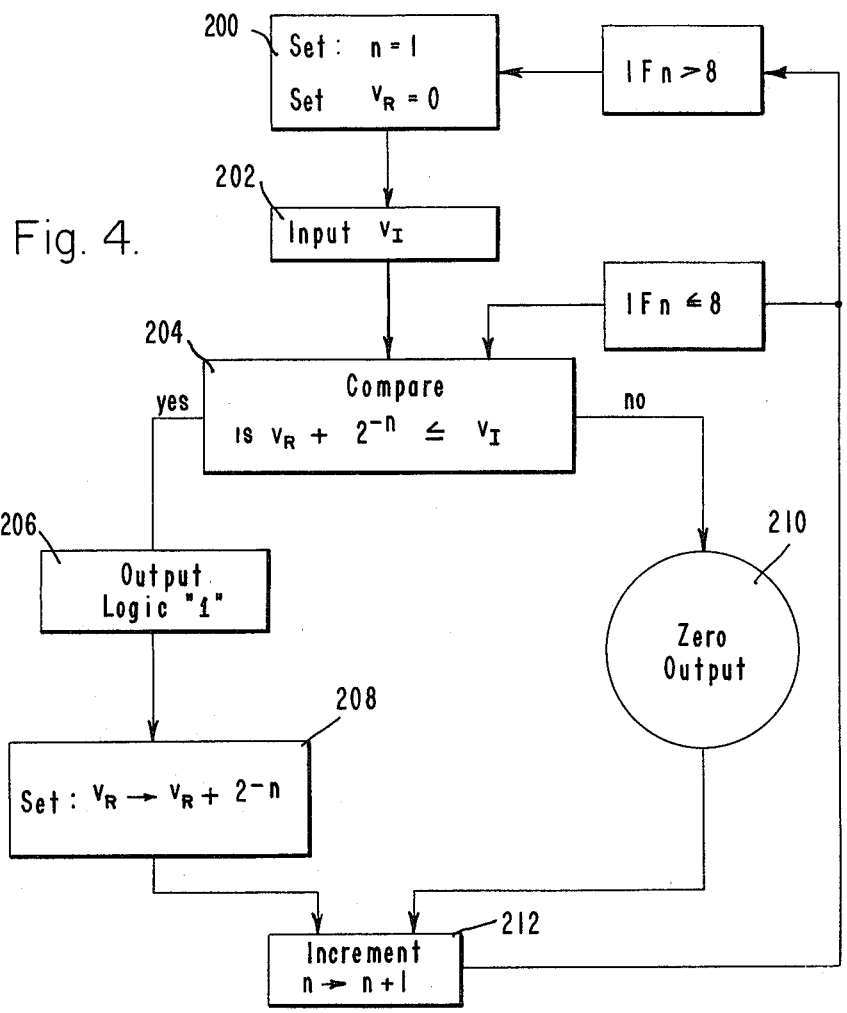
FIG. 4 is a functional block diagram illustrating the process performed by the analog-to-digital converter of FIG. 1.

The charge coupled device analog-to-digital converter of this invention illustrated in FIG. 1 converts analog signals into eight bit binary words using successive approximations in an algorithm illustrated in the block diagram of FIG. 4. Operation begins each time the clock signal $\phi_c$ is positive, or "on", causing the potential $V_r$ of the common electrode 98 in the digital-to-analog converter 7 to be set to the voltage $V_c$, corresponding to the block 200 in FIG. 4 in which $V_r$ is set to $V_c$. Simultaneously, a charge packet is created in the shift register 3. Later, after $\phi_c$ is off and $\phi_l$ is turned on, it is stored under the first electrode 78a in the shift register 3, corresponding to block 200 in FIG. 4 in which an addressing index n is set equal to 1 and a reference voltage $V_r$ is generated in the converter 7 and supplied to the comparator 1. Also, when the clock signal $\phi_l$ is positive ("on"), a charge packet proportional to the analog input signal $V_i$ is stored beneath the storage electrode 26 in the comparator 1, corresponding to block 202 in FIG. 4. As indicated in block 204 of FIG. 4, when the clock signal $\overline{\phi_l}$ is on, the analog signals $V_i$ and $V_r$ are compared, and if $V_i$ is more positive than $V_r$, at least some of the charge stored beneath the storage electrode 26 passes beneath the sensing diffusion 36, triggering regenerative feedback in the second charge flow channel 16 in the comparator 1 to generate a logic "one" at the output 68 as indicated in block 206, which is stored in the register 9 and is sensed at each of the set controls 92 of the latches 5. At this point, the signal input 84 and the set control 92 of only the latch 5a are both "true", which causes the output 86 of the latch 5a exclusively to be set true, so that the reference potential $V_r$ is set to a potential proportional to $2^{-1}$ volts, corresponding to block 208. If, on the other hand, the comparison made by the comparator 1 is negative, a logic zero will be stored in the register 9 and the latch 5a will not be set, as indicated in block 210. When the clock signal $\phi_l$ is again on, the charge packet in the shift register 3 is transferred beneath the next electrode 78b, corresponding to an incrementation of the addressing index n as indicated in block 212, and transfer beneath succeeding electrodes is accomplished in a similar manner, as illustrated in block diagram of FIG. 4. Thus, the resettable latches 5 permit the shift register 3 to sequentially address selected voltages proportional to combinations of the eight fractional binary numbers $2^{-1}, 2^{-2}, 2^{-3}, \ldots 2^{-8}$ in successive approximations to generate an analog reference voltage $V_r$ which precisely matches the analog input voltage $V_i$.

Figure 3:
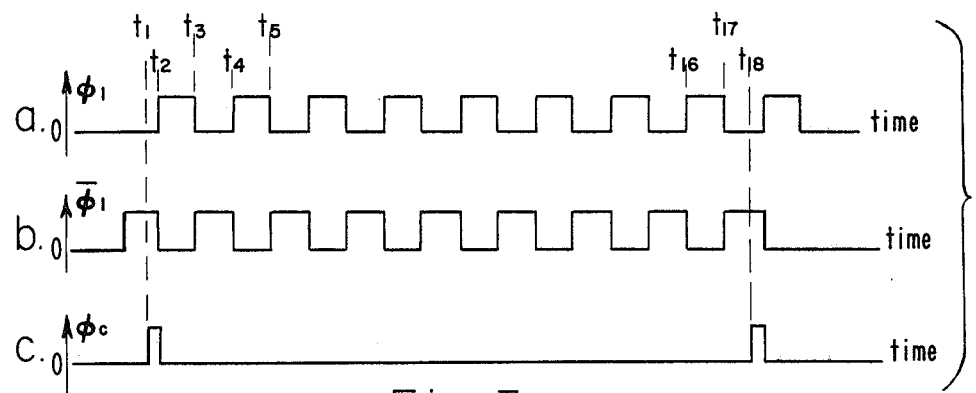
FIG. 3 includes diagrams of the time domain waveforms of the various clock signals controlling the device of FIG. 1.

Operation of the analog-to-digital converter illustrated in FIG. 1 will now be described in detail by simultaneous reference to FIGS. 3a, 3b and 3c. At time $t_1$ of FIG. 3, the clock signal $\phi_l$ is off (zero volts potential) while the clock signals $\overline{\phi_l}$ and $\phi_c$ are both on (positive 15 volts potential). The clock signal $\phi_c$ is applied to all of the reset controls 94 to set each of the latches 5. The clock signal $\phi_c$ is also applied to the sample and hold means 28 to supply a voltage proportional to the instantaneous value of the analog input signal $V_i$ to the input transistor 32 in the comparator 1. Simultaneously, the potential of the common electrode 98 in the digital-to-analog converter 7 is set to the voltage $V_c$ by the application of the clock signal $\phi_c$, which is also applied to the input electrodes 72 and 74 in the shift register 3, thus permitting transfer of a charge packet from the diode diffusion 70. At time $t_2$ of FIG. 3, the clock signal $\phi_l$ is on while the clock signal $\phi_l$ is off, permitting a charge packet to be transferred from each of the input diodes 18 and 50 into the first and second charge flow channels 14 and 16, respectively, of the comparator 1. The charge packet in the first charge flow channel 14 is stored beneath a storage electrode 26 in the potential well 44, the height of which is determined by the magnitude of the voltage $V_r$ from the converter 7. Also, the clock signal $\phi_l$ causes the substrate surface beneath the reset electrode 40 to be inverted, which allows excess charge to be swept into the drain diffusion 42. The height of the barrier 46 at this time is determined by the magnitude of the reference voltage $V_r$ coupled through the transistor 34 from the converter 7 to the barrier electrode 30.

Also, at time $t_2$ while the clock signal $\phi_l$ is on, the charge packet which was fed into the second charge flow channel 16 from the input diffusion 50 is stored in the potential storage well 66 having a depth which is determined by the source voltage of the transistor 58 applied to the storage electrode 56. Also at time $t_2$, the charge packet introduced beneath the input electrodes 72 and 74 in the shift register 3 is transferred beneath the first storage electrode 78a to be sensed by the first floating diffusion 80a, causing a less positive signal to be applied to the signal input 84 of the first reset-table latch 5a, which is inverted at its output 86, supplying a positive voltage to be coupled through the first capacitor electrode 100a in the digital-to-analog converter 7 to the common electrode 98. As a result, a reference voltage $V_r$ having a potential proportional to $2^{-1}$ volt appears at the reference input 103 to the comparator 1.

At time $t_3$, the clock signal $\phi_l$ is off while the clock signal $\overline{\phi_l}$ is on, causing transistor 34 in the comparator 1 to be turned off while the transistor 32 is turned on. Thus, the comparison electrode 30 is disconnected from the voltage $V_r$ and is connected instead to the voltage $V_i$. If the reference voltage $V_r$, which at this time is proportional to $2^{-1}$ volts, is more positive than the sampled input signal $V_i$, the height of the potential barrier 46 will not decrease, so that the sensing diffusion 36 senses no charge, and no change to the system takes place. In this event, when the clock signal $\phi_l$ is turned on at time $t_4$, the charge packet in the shift register 3 will be transferred beneath the second storage electrode 78b to be sensed by the second floating diffusion 80b, thereby deactivating the first latch 5a and activating the second latch 5b. Thus, no output signal is generated at the comparator output 68 to the output register 9 when the clock signal $\phi_l$ causes the register 9 to shift, thus creating an empty bucket or "zero" in the output register 9.

On the other hand, if at time $t_3$ the sampled input signal $V_i$ is more positive than reference voltage $V_r$, the height of the potential barrier 46 will decrease, causing charge stored in the storage well 44 to spill over the reduced barrier 46 into the adjacent potential well 48, to be sensed by the floating diffusion 36. The resulting change in the potential of the floating diffusion 36 is sensed at time $t_3$ by the floating diffusion 38 in the second charge flow channel 16. Because the floating diffusion 38 in the second charge flow channel 16 is connected directly to the gate of the transistor 58, the source-to-drain resistance of the transistor 58 increases, thereby decreasing the amount of positive voltage supplied from the drain voltage supply of $V_d$ through the transistor 58 to the storage electrode 56. Therefore, in the second charge flow channel 16, the depth of the storage well 66 beneath the storage electrode 56 decreases, causing charge stored in the potential well 66 to spill into the adjacent potential well 68 underlying the sensing diffusion 38, further increasing the source-to-drain resistance of the transistor 58. This creates a regenerative feedback loop to rapidly decrease the amount of positive voltage applied to the output 68 of the comparator 1, thus generating a negative-going pulse or "logic 1" at the output 68 of the comparator 1, which is stored in the output register 9.

Significantly, even slight differences between the sampled analog input signal $V_i$ and the reference voltage $V_r$ selected from the digital-to-analog converter 7 are sensed by the comparator 1 and result in a logic 1 appearing at the output 68 of uniform magnitude by reason of the charge coupled regenerative feedback loop in the charge coupled device comparator 1. The logic 1 appearing at the output 68 of the comparator 1 is applied to each of the set controls 92 of the eight resettable latches 5. However, only the first resettable latch 5a has a signal at its input 84 at time $t_3$ so that only the first resettable latch 5a will have its output 86 permanently set. It should be noted that the negative charge sensed by the first sensing diffusion 80a in the shift register 3 causes a negative voltage to be applied to the signal input 84 of the first latch 5a, which is inverted to a positive voltage at the output 86 of the first latch 5a. Thereafter, the permanently set latch 5a continuously applies a positive voltage to the first capacitive electrode 100a in the converter 7, creating a reference voltage $V_r$ on the output conductor 103 proportional to $2^{-1}$ volt.

At time $t_4$, the clock signal $\phi_I$ is again "on", causing the charge packet introduced into the shift register 3 to be transferred beneath the second storage electrode 78b and sensed by the second floating diffusion 80b, activating the second resettable latch 5b. This causes a voltage proportional to $2^{-2}$ volts to be coupled through the second electrode 100b in the converter 7 to the common electrode 98 and superimposed on the original reference voltage of $2^{-2}$ volt, so that, $V_r$ is now proportional to $2^{-1}+2^{-2}$ volt, assuming that the first comparison at time $t_3$ was positive. Furthermore, charge packets stored at either one of the floating diffusions 36 and 38 in the first and second charge flow channels 14 and 16, respectively, are swept under the reset electrodes 40 and 62, respectively, to the drain diffusions 42 and 64, respectively, thus clearing the comparator 1. Again, the height of the barrier 46 beneath comparison electrode 30 is determined by the voltage $V_r$ which is coupled at time $t_4$ through the transistor 34 to the comparison electrode 30. Subsequently, at time $t_5$, the clock signal $\phi_I$ is off while the clock signal $\overline{\phi_I}$ is on, causing the transistor 34 to be turned off and the transistor 32 to be turned on in the first charge flow channel 14. A second comparison is then made in which, if the voltage $V_r$ on the common electrode 93 in the converter 7 is less positive than the sampled analog voltage $V_i$, the surface potential beneath the comparison electrode 30 will decrease, causing charge to be sensed in the sensing diffusion 36 in the first charge flow channel 14, creating a regenerative feedback loop in the second charge flow channel 16, as described above, to generate logic 1 at the output of the comparator 1. The logic "1" is applied to the set control 92 of each of the resettable latches 5. However, only the second resettable latch 5b has been activated by the charge packet underlying the second storage electrode 78b in the shift register 3, so that only the second resettable latch 5b is permanently set. If in the first comparison at time $t_3$ a logic one is generated at the comparator output 68, then, at the completion of the second comparison at time $t_5$, the reference voltage $V_r$ is proportional to the sum of the voltages applied to the first and second electrodes 100a, 100b in the converter 7, so that $V_r$ is permanently set proportional to $2^{-1}+2^{-2}$ volt. At time $t_5$, the second bit stored in the output register 9 is a logic 1 or 0 depending upon whether or not a logic 1 is generated at the comparator output 68 at time $t_5$.

Again, time $t_6$, the clock signal $\phi_I$ is on and the process is repeated as described above, with the difference that the shift register addresses the third capacitive electrode 100c in the converter 7 through the third resettable latch 5c when the charge packet underlies the third storage electrode 78c in the shift register 3 to be sensed by the third floating diffusion 80c. Again, the comparator 1 performs a third comparison to determine whether or not the third bit to be stored in the output register 9 is to be a 1 or a 0. The process is repeated so that the shift register successively addresses the fourth, fifth, sixth, seventh and eighth electrodes 100 in the converter 7 to generate the remaining bits of the eight bit word to be stored in the output register 9. The final and eighth comparison is performed by the comparator 1 at time $t_{17}$. Thereafter, the entire system is reset to its original state by the application of the clock signal $\phi_c$ at time $t_{18}$. At time $t_{19}$ the original charge packet in the shift register 3 is transferred into the drain diffusion 82 while a new charge packet is introduced into the shift register 3 to be stored beneath the first electrode 78, and the entire process described above is repeated to generate a new eight bit word to be stored in the output register 9.

The eight bit word stored in the output register 9 corresponds to a reference voltage $V_r$ generated by addressing selected ones of the capacitive electrodes 100a–h of the digital-to-analog converter 7 to produce a linear combination of selected voltages. Each of the electrodes 100 is selected by setting a corresponding one of the resettable latches 5. Alternatively, the eight bit word may be reconstructed from the output state of the eight resettable latches 5a–h at time $t_{17}$, corresponding to each bit of the eight bit binary word output.

It should be apparent to those skilled in the art that the converter of the present invention may be formed as either a p or n channel charge coupled device, although in the preferred embodiment it is formed as an n-channel charge coupled device to assure the maximum device speed. It is within the scope of this invention to provide any similar converter which generates an n-bit binary word output from a given sampled analog input $V_i$ where n is any integer. In the preferred embodiment, the generation of an eight bit binary word from an analog voltage requires the use of an eight bit shift register 3, eight resettable latches 5a–h and a digital-to-analog converter 7 having eight electrodes 100a–h, while the transfer clock signals $\phi_I$ and $\overline{\phi_I}$ are operated at a frequency eight times the frequency of the clock signal $\phi_c$. Alternatively, if a sixteen bit digital-to-analog word is to be generated in accordance with the present invention, a sixteen bit register 3 and a total of sixteen resettable latches 5 would be used in place of the eight resettable latches 5a–h and a digital-to-analog converter having sixteen electrodes corresponding to the first sixteen fractional binary numbers $2^{-1}$ through $2^{-16}$ would be used in place of the converter 7, while the transfer clock signals $\phi_I$ and $\overline{\phi_I}$ would be operated at 16 times the frequency of the clock signal $\phi_c$.

In summary, a charge coupled device analog-to-digital converter has been provided which uses a successive approximation comparison algorithm in which the sensitivity of the comparison process is enhanced by charge coupled regenerative feedback. The geometry and power consumption of the analog-to-digital converter is significantly reduced, while permitting the analog-to-digital converter of the invention to be integrated on a monolithic substrate with other charge coupled devices without requiring additional hardware to provide compatability.

What is claimed is:

1. A charge coupled device analog-to-digital converter formed on a semiconductive substrate for converting a sampled analog input signal into binary data by successive approximations, comprising:

an analog reference voltage generator having a plurality of n selectively latchable voltage sources for supplying an analog reference signal which is a combination of the outputs of the latched ones of said voltage sources;

a first charge flow channel in said substrate and an electrode structure capable of maintaining a potential well defined between two potential barriers in said channel for storing charge in an amount proportional to the height of said barriers;

transfer electrodes over said first channel for transferring charge beneath said electrode structure into said potential well;

a first circuit controlling said electrode structure so as to periodically set the height of one of said barriers adjacent said potential well in proportion to said sampled analog input signal;

a second circuit controlling said electrode structure so as to periodically set the height of said one barrier adjacent said potential well in proportion to said analog reference signal, each setting of said barrier height in proportion to said analog input signal being accompanied by a corresponding setting of said barrier height in proportion to said reference signal, so that at least some of the stored charge overflows said well whenever the barrier height set in proportion to said input signal exceeds the barrier height set in proportion to said reference signal;

means, including a charge coupled regenerative feedback loop, for generating a logic signal when charge overflows said potential well after a given pair of said barrier height setting operation, said regenerative feedback loop comprising:

charge coupled means for sensing said overflow of charge from said potential well in said first channel;

a second charge flow channel in said substrate having an electrode structure capable of maintaining a second potential well in said second channel for storing charge;

transfer electrodes over said second channel for transferring charge into said second potential well;

means controlling said second channel electrode structure operably connected to said means for sensing overflow in said first channel for reducing the amount of charge stored in said second potential well in response to said first channel means for sensing overflow so as to cause charge overflow from said second potential well in said second channel; and means sensing said charge overflow in said second channel operably connected to said second channel controlling means to further reduce the amount of charge stored in said second potential well in response to said second channel charge overflow so as to remove a substantial amount of the stored charge from said second potential well whenever charge overflow occurs in said first channel;

a shift register connected to sequentially address said n selectively latchable voltage sources so that a successive one of said voltage sources is addressed after each of said pair of charge setting operations; and means connected to said shift register and to said reference voltage generator for latching each said voltage source upon it being addressed by said shift register whenever said addressing follows a pair of barrier setting operations which result in the generation of a logic signal.

2. The device of claim 1 wherein said first circuit comprises a first transistor having a source, drain and gate operably connecting said analog input signal through said source and drain to a portion of said electrode structure under the control of a first signal applied to said gate.

3. The device of claim 2 wherein said second circuit comprises a second transistor having a source, drain and gate operably connecting said reference signal to a portion of said electrode structure through said source and drain under control of a second signal applied to said gate.

4. The device of claim 3 in which said first and second signals are complementary pulse trains.

5. The device of claim 3 in which said first charge flow channel is an n-channel charge coupled device and said first and second transistors are n-channel field effect transistors formed on said substrate with said charge coupled device.

6. A charge coupled device analog-to-digital converter formed on a semiconductive substrate for converting a sampled analog input signal into binary data by successive approximations, comprising:

an analog reference voltage generator having a plurality of n selectively latchable voltage sources for supplying an analog reference signal which is the sum of the outputs of the latched ones of said voltage sources;

a first charge flow channel in said substrate and an electrode structure capable of maintaining a potential well defined between two potential barriers in said channel for storing charge in an amount proportional to the height of said barriers;

transfer electrodes over said first channel for transferring charge beneath said electrode structure toward said potential well;

a first circuit controlling said electrode structure so as to periodically set the height of one of said barriers in proportion to said sampled analog input signal;

a second circuit controlling said electrode structure so as to periodically set the height of said one barrier in proportion to said analog reference signal, each setting of said barrier height in proportion to said analog input signal being accompanied by a corresponding setting of said barrier height in proportion to said reference signal;

a control electrode proximate said potential well and operatively connected to said first and second circuits to cause said potential well to overflow whenever the barrier height set in proportion to said input signal exceeds the barrier height set in proportion to said reference signal;

means, including a charge coupled regenerative feedback loop, for generating a logic signal when charge overflows said potential well after a given pair of said charge setting operations, said regenerative feedback loop comprising:

charge coupled means for sensing said overflow of charge from said potential well in said first channel;

a second charge flow channel in said substrate having an electrode structure capable of maintaining a second potential well in said second channel for storing charge;

transfer electrodes over said second channel for transferring charge into said second potential well;

means controlling said second channel electrode structure operably connected to said means for sensing overflow in said first channel for reducing the amount of charge stored in said second potential well in response to said first channel means for sensing overflow so as to cause charge overflow from said second potential well in said second channel; and means sensing said charge overflow in said second channel operably connected to said second channel controlling means to further reduce the amount of charge stored in said second potential well in response to said second channel charge overflow so as to remove a substantial amount of the stored charge from said second potential well whenever charge overflow occurs in said first channel;

a shift register connected to sequentially address said n selectively latchable voltage sources so that a successive one of said voltage sources is addressed after each of said pair of barrier setting operations; and means connected to said shift register and to said reference voltage generator for latching each said voltage source upon it being addressed by said shift register whenever said addressing follows a pair of barrier setting operations which result in the generation of a logic signal.

7. A charge coupled device analog-to-digital converter formed on a semiconductive substrate and controlled by first and second trains of complementary clock signals for converting a sampled analog input signal into binary data by successive approximations, comprising:

an analog reference voltage generator having a plurality of n selectively latchable voltage sources for supplying an analog reference signal which is the sum of the outputs of the latched ones of said voltage sources;

a first charge flow channel in said substrate and an electrode structure capable of maintaining a potential well defined between two potential barriers in said channel for storing charge in proportion to the height of said barriers;

transfer electrodes over said first channel for transferring charge beneath said electrode structure toward said potential well in synchronism with said first clock signals;

a first circuit controlling said electrode structure so as to set the height of one of said barriers in synchronism with said first clock signals and in proportion to said sampled analog input signal;

a second circuit controlling said electrode structure so as to set the height of said one barrier in synchronism with said second clock signals and in proportion to said analog reference signal, each setting of said barrier height in proportion to said analog input signal being accompanied by a corresponding setting of barrier height in proportion to said reference signal;

a control electrode proximate said potential well and operatively connected to said first and second circuits to cause said potential well to overflow whenever the barrier height set in proportion to said input signal exceeds the barrier height set in proportion to said reference signal;

means, including a charge coupled regenerative feedback loop, for generating a logic signal when charge overflows said potential well after a given pair of said barrier setting operations, said regenerative feedback loop comprising:

charge coupled means for sensing said oveflow of charge from said potential well in said first channel;

a second charge flow channel in said substrate having an electrode structure capable of maintaining a second potential well in said second channel for storing charge;

transfer electrodes over said second channel for transferring charge into said second potential well;

means controlling said second channel electrode structure operably connected to said means for sensing overflow in said first channel for reducing the amount of charge stored in said second potential well in response to said first channel means for sensing overflow so as to cause charge overflow from said second potential well in said second channel; and means sensing said charge overflow in said second channel operably connected to said second channel controlling means to further reduce the amount of charge stored in said second potential well in response to said second channel charge overflow so as to remove a substantial amount of the stored charge from said second potential well whenever charge overflow occurs in said first channel;

a shift register connected to sequentially address said n selectively latchable voltage sources so that a successive one of said voltage sources is addressed after each of said pair of charge setting operations; and means connected to said shift register and to said reference voltage generator for latching each said voltage source upon it being addressed by said shift register whenever said addressing follows a pair of barrier setting operations which result in the generation of a logic signal.

8. A charge coupled device analog-to-digital converter formed on a semiconductive substrate and controlled by first and second trains of complementary clock signals for converting a sampled analog input signal into binary data by successive approximations, comprising:

an analog reference voltage generator having a plurality of n selectively addressable voltage sources for supplying an analog reference signal;

a first charge flow channel in said substrate and an electrode structure capable of maintaining a potential well defined between two potential barriers in said channel for storing charge in proportion to the height of said barriers;

transfer electrodes over said first channel for transferring charge beneath said electrode stucture in synchronism with said first clock signals;

a first circuit controlling said electrode structure so as to set the height of one of said barriers in synchronism with said first clock signals and in proportion to said sampled analog input signal;

a second circuit controlling said electrode structure so as to set the height of said one barrier in synchronism with said second clock signals and in proportion to said analog reference signal;

a control electrode proximate said potential well and operatively connected to said first and second circuits to cause said potential well to overflow whenever the barrier height set in proportion to said input signal exceeds the barrier height set in proportion to said reference signal;

means for sensing charge overflowing said potential well in said first charge flow channel;

a charge coupled regenerative feedback loop responsive to said sensing means for generating a logic signal when charge overeflows said potential well, said regenerative feedback loop comprising:

charge coupled means for sensing said overflow of charge from said potential well in said first channel;

a second charge flow channel in said substrate having an electrode structure capable of maintaining a second potential well in said second channel for storing charge;

transfer electrodes over said second channel for transferring charge into said second potential well;

means controlling said second channel electrode structure operably connected to said means for sensing overflow in said first channel for reducing the amount of charge stored in said second potential well in response to said first channel means for sensing overflow so as to cause charge overflow from said second potential well in said second channel; and means sensing said charge overflow in said second channel operably connected to said second channel controlling means to further reduce the amount of charge stored in said second potential well in response to said second channel charge overflow so as to remove a substantial amount of the stored charge from said second potential well whenever charge overflow occurs in said first channel;

a shift register connected to sequentially address said n selectively addressable voltage sources in synchronism with said first clock signals; and means for latching each of said n addressable voltage sources in response to said shift register whenever said regenerative feedback loop generates a logic signal.

* * * * *